(12) United States Patent
Lorusso et al.

(10) Patent No.: US 7,361,941 B1
(45) Date of Patent: Apr. 22, 2008

(54) CALIBRATION STANDARDS AND METHODS

(75) Inventors: Gian F. Lorusso, Leefdaal (BE); Christopher F. Bevis, Los Gatos, CA (US); Luca Grella, Gilroy, CA (US); David L. Adler, San Jose, CA (US); Ian Smith, Los Gatos, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 29 days.

(21) Appl. No.: 11/022,481

(22) Filed: Dec. 21, 2004

(51) Int. Cl.
*H01J 33/00* (2006.01)
*G01J 1/10* (2006.01)

(52) U.S. Cl. .................... 257/100; 356/243.1

(58) Field of Classification Search ................ 250/306, 250/307, 491.1
See application file for complete search history.

(56) References Cited

U.S. PATENT DOCUMENTS

| | | | |
|---|---|---|---|
| 5,534,359 A | 7/1996 | Bartha et al. | 428/688 |
| 5,665,905 A | 9/1997 | Bartha et al. | 73/105 |
| 5,684,301 A | 11/1997 | Cresswell et al. | 250/306 |
| 5,914,784 A | 6/1999 | Ausschnitt et al. | 356/624 |
| 5,920,067 A | 7/1999 | Cresswell et al. | 250/306 |
| 5,955,654 A | 9/1999 | Stover et al. | 73/1.89 |
| 5,960,255 A | 9/1999 | Bartha | 438/14 |
| 5,969,273 A | 10/1999 | Archie et al. | 73/865.8 |
| 6,016,684 A | 1/2000 | Scheer et al. | 73/1.89 |
| 6,128,089 A | 10/2000 | Auschnitt et al. | 356/401 |
| 6,317,211 B1 * | 11/2001 | Ausschnitt et al. | 356/401 |
| 6,384,408 B1 * | 5/2002 | Yee et al. | 250/252.1 |
| 6,433,878 B1 * | 8/2002 | Niu et al. | 356/603 |
| 6,472,662 B1 * | 10/2002 | Archie | 250/307 |
| 6,570,157 B1 * | 5/2003 | Singh et al. | 250/311 |
| 6,573,498 B1 * | 6/2003 | Rangarajan et al. | 250/307 |
| 6,646,737 B2 * | 11/2003 | Tortonese et al. | 356/243.4 |
| 6,770,868 B1 * | 8/2004 | Bevis et al. | 250/252.1 |
| 6,986,280 B2 * | 1/2006 | Muckenhirm | 73/104 |
| 2002/0131055 A1 * | 9/2002 | Niu et al. | 356/603 |
| 2003/0010912 A1 * | 1/2003 | Archie | 250/307 |
| 2003/0048458 A1 * | 3/2003 | Mieher et al. | 356/601 |
| 2003/0058437 A1 * | 3/2003 | Tortonese et al. | 356/243.4 |
| 2003/0112523 A1 * | 6/2003 | Daniell | 359/626 |
| 2003/0168594 A1 * | 9/2003 | Muckenhirn | 250/307 |
| 2003/0187602 A1 * | 10/2003 | Bao et al. | 702/94 |
| 2004/0070740 A1 * | 4/2004 | Irie | 355/52 |
| 2005/0185174 A1 * | 8/2005 | Laan et al. | 356/243.1 |
| 2006/0009872 A1 * | 1/2006 | Prager et al. | 700/121 |
| 2006/0113556 A1 * | 6/2006 | Hughes | 257/100 |

OTHER PUBLICATIONS

US 5,841,144, 11/1998, Creswell (withdrawn).

(Continued)

*Primary Examiner*—Robert Kim
*Assistant Examiner*—Johnnie L Smith, II
(74) *Attorney, Agent, or Firm*—Joshua D. Isenberg; JDI Patent

(57) ABSTRACT

Parameters of a metrology tool may be determined by measuring a dimension of a feature on a calibration standard with the tool and using the measured dimension and a known traceable value of the dimension to determine a value for the parameter. If the dimension of the feature on the standard has a known traceable value, different standards may be used to calibrate different tools.

29 Claims, 6 Drawing Sheets

OTHER PUBLICATIONS

Allen et al., "Sheet and Line Resistance of Patterned SOI Surface Film CD Reference Materials as a Function of Substrate Bias," 1999, in *Proceedings if the IEEE 1999 Conference one Microelectronic Test Structuers*, vol. 12, Mar. 1999, pp. 51-55.

Allen et al., "Evaluation of Surface Depletion Effects in Single-Crystal Test Structures for Reference Materials Applications," in *Characterization and Metrology for ULSI Technology: 1998 International Conference*, 1998, pp. 357-352., American Institute of Physics, College Park, MD.

Allen et al., "Comparison of Properties of Electrical Test Structures Patterned in BESOI and SIMOX Films for CD Reference-Material Applications," SPIE vol. 3332, 1998, pp. 124-131.

UCSB College of Engineering Press Release : "Researchers Discover How to Make the Smallest, Most Perfect, Densest Nanowire Lattices—And It's a SNAP", Mar. 13, 2003, http://www.engineering.ucsb.edu/Announce/nanowire.html/.

Cresswell et al. "Electrical Linewidth Test Structures Fabricated in Monocrystalline Films for Reference-Material Applications", 1998, pp. 182-193.

MAG*I*CAL® DELUXE, A Magnification Calibration Sample for Transmission Electron Microscopes, from http://www.emdiasum.com/ems/calibration/magical.html, Nov. 14, 2003.

\* cited by examiner

CALIBRATION STANDARDS AND METHODS

FIELD OF THE INVENTION

This invention generally relates to the field of metrology and more particularly to dimensional calibration standards and methods of manufacture and use.

BACKGROUND OF THE INVENTION

In the integrated circuit industry, electron microscopes are central to microstructural analysis of integrated circuit components. The quality of a finished integrated circuit is highly dependent on the measurement and control of the circuit's critical dimensions. Thus, it is very important to ensure that critical dimension measurements received from metrology tools, such as electron microscopes, are precise and accurate. Typically, in critical dimension analysis of an integrated circuit component an electron microscope measures the apparent width of a structure when determining its dimensions. The apparent width of the structure is compared to critical dimension specifications in order to determine the compliance of the integrated circuit component.

Unfortunately, there are disadvantages to using the typical apparatus and method, as the apparent width of a structure as reported by the measurement tool is often different from the actual width of the structure. In addition, the discrepancy between the actual width and the apparent width of the structure could fluctuate from day to day, as well as from tool to tool. Thus, the integrity of the data derived from such measurements is often called into question, and is difficult to rely on.

In an effort to overcome this problem, it is possible to use a calibration piece having a structure with a known size. The calibration piece is loaded into the measurement tool and measured at regular intervals, such as once each day. The difference between the apparent width and the actual width of the structure on the calibration piece is used as a correction factor for other measurements. Unfortunately, even this procedure tends to not have the desired accuracy in all situations.

Similarly, calibration pieces have been used that are optimized for viewing on an electron microscope, such as tin-on-gold resolution standards. These are used to verify the proper functioning of the electron microscope, and to measure the inherent resolution of the electron microscope. Unfortunately, because the interaction between the electron beam and the calibration piece is very different on such standards in comparison with the interaction between the electron beam and the semiconductor samples to be measured, the data produced is unfortunately of limited use in calibrating the scanning electron microscope for use as a measurement tool.

There have been attempts to take into account the effects the interaction between the electron beam and sample when making measurements. For example, commonly-assigned U.S. Pat. No. 6,770,868 describes measurement techniques using calibration standards with known metrics. A calibration factor for the measurement tool is computed by comparing the first measurement to the first known metric. A structure on the sample is then measured using a measurement tool to produce a precursor measurement. This precursor measurement is adjusted with the calibration factor to produce an intermediate measurement. Then the intermediate measurement is adjusted with the sample composition data to produce the actual measurement. Thus, rather than naively processing the scan data from the measurement tool (e.g., an electron microscope) to produce a measurement result, a model is applied that takes into account (1) how the electron optics perform, including their deviations from ideality, and (2) how the incident electrons interact with the structure on the sample to produce secondary and backscattered electrons. The properties of the electron optical system can be derived from both an analytical model of the optical system and from the measurement data taken on the calibration standard. The actual physical properties of the sample can then be determined using an analytical model of the interaction of the incident beam with the sample and the properties of the electron optical system as determined above.

Such a system can improve measurement data somewhat by correcting the apparent width of a structure by both a calibration factor, which accounts for any drift in the properties of the measurement tool, and by sample structural and composition data, which accounts for measurement differences due to different materials and structures being measured. By calibrating the measurement tool in this manner, the precision and accuracy of the measurement tool is improved. Unfortunately, such systems use calibration standards of a similar composition of the structure to be measured, in order to provide correct measurements of structures consisting of a wide range of materials. These calibration standards are not sufficiently generic that they can be easily used for different types of samples.

Furthermore, it is often desirable to measure the same sample or sets of similar samples with two or more different tools. In order to properly compare the measurements made with different tools, each tool's parameters must be calibrated and modeled as described above. To properly model the tools, the same calibration standard must be used to model the behavior of each tool. This can be particularly inconvenient if the tools are in different locations that are separated from each other by large distances.

Thus, there is a need in the art for a standard that overcomes these drawbacks and a technique for extracting tool parameters and performing tool matching with such standards.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Figure 1:
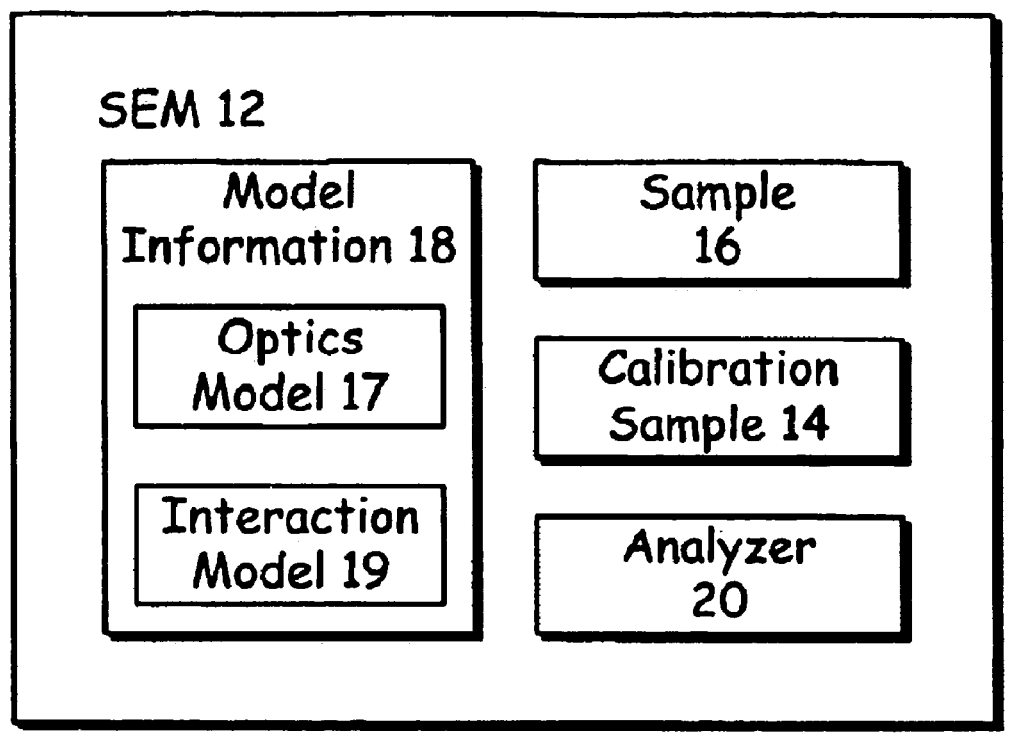
FIG. 1 is a functional block diagram showing a measurement tool for determining an actual measurement in critical dimension review according to a preferred embodiment of the invention.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

According to embodiments of the present invention, parameters of a metrology tool may be determined by measuring a dimension of a feature on a calibration standard with the tool and using the measured dimension and a known traceable value of the dimension to determine a value for the parameter. If the dimension of the feature on the standard has a known traceable value, different standards may be used to calibrate different tools.

Once determined, the value of the parameter may be entered into a model-based metrology library. Once the parameters are known, a calibration curve for the tool may be generated from the model-based metrology library. Model-based metrology uses a software algorithm to model a system used to generate a predicted signal based on parameters of the measurement system. The parameters are often unknown. However, if the system measures a feature having known properties (e.g., traceably measured dimensions), model-based metrology may determine the system parameters by comparing the measured signal with the predicted signal and iteratively changing the parameters in the model until the predicted signal matches the measured signal.

In some embodiments, the metrology tool is an electron beam tool and the parameters are electron optical parameters commonly associated with electron beam systems. In other embodiments, the metrology tool is a probe-based tool, such as an atomic force microscope, and the parameter may be a probe tip width or probe tip shape.

As used herein, a measurement is said to be "traceable" or "traceably measured" if the measurement has been made with a measurement system calibrated with a standard reference material traceable to a national testing authority. Artifacts whose properties are traceable to fundamental quantities (e.g. speed of light, angle, wavelength of cesium etc.) are also regarded as "traceable". Examples of national testing authorities include, but are not limited to national laboratories such as the National Institute of Standards and Technology (NIST—Gaithersburg, Md., U.S.), the Institute for National Measurement Standards (Montreal, Canada), the National Institute of Metrology (Beijing China, China), the Bureau National de Metrólogié (Paris, France), the Federal Institute for Materials Research and Testing (BAM—Berlin, Germany), The National Physics Laboratory (New Delhi, India), the Istituto di Metrologia "G. Colonnetti" (IMGC—Torino, Italy), the National Metrology Institute of Japan (Ibaraki, Japan), the National Physical Laboratory Center for Basic Metrology (Teddington, UK), the Bureau International des Poids et Mesures (BIPM—Sevres Cedex, France) and the International Organization of Legal Metrology (OIML—Paris, France). In addition, national testing authorities also include other laboratories delegated by the national laboratories.

FIG. 1 depicts a functional block diagram of a system 10 according to an embodiment of the present invention. The system includes a metrology tool, e.g., an electron microscope, such as a scanning electron microscope 12 of the type commonly used for critical dimension measurement in industries such as the integrated circuit fabrication industry (i.e., a CD-SEM). The parameters to be determined for such a system include, but are not limited to spot profile, tilt angle with respect to a measurement target, rotation angle with respect to a measurement target, resolution, charging, numerical aperture, atomic number, landing energy, aberration, energy spread, material electron yield, spatial distortion, spatial variation, or time variation of parameters to be determined. The electron microscope 12 is adapted to take measurements on a sample 16, such as a production sample, on which a measurement is to be taken for comparison to specification values. The system also preferably includes a calibration standard 14, model information 18, and an analyzer 20, all of which are described with greater particularity below. It is appreciated that the model information 18 and analyzer 20 may be a part of the electron microscope 12, or may be separate elements that reside exterior to the electron microscope 12, such as on a computer that is connected to the electron microscope 12 such as by network connections.

The calibration standard 14 includes one or more features on which measurements can be taken by the electron microscope 12. These features include one or more dimensions that have values that are known and traceable. Examples of such dimensions include, but are not limited to properties such as geometric dimensions (e.g., height, width, depth, angle), chemical composition (e.g., atomic number), electrical properties, e.g., voltage, charge, resistance, resistivity and the like.

The features on the calibration sample 14 may be formed of the same or similar materials as the sample 16 to be measured by the SEM 12. Further, the general physical structure of the features on the calibration standard 14 may also be either the same or similar to those on the sample 16 to be measured. By "similar" it is meant that the interaction between the feature on the calibration sample 14 and the electron beam of the SEM 12 behave in a substantially similar way as the interaction between the sample 16 to be measured and the electron beam of the SEM 12.

Electron microscopes 12 tend to produce differing apparent widths based at least in part upon the constitution of a measurement sample, or in other words, based upon what the sample is made of and on the physical structure of the feature. At least some of the features on a given calibration standard 14 may be formed of the same material and structure, or of a similar material and structure, as that of the sample 16 which is to be measured. In this manner, errors that could otherwise be introduced as a result of the dissimilarity between the material and structure of the calibration standard 14 and the sample to measured 16 may be avoided. Alternatively, different calibration standards 14 could be used where each of the measurement sites formed on a given calibration standard 14 are all formed of the same material. In this embodiment, a calibration sample 14 having features formed of the same material as the sample 16 to be measured is preferably used during the calibration procedure of the electron microscope 12.

Preferably, a new feature on the selected calibration standard 14 is measured and used as a part of the calibration procedure of the electron microscope 12. Most preferably, a new site is measured each time the calibration procedure is accomplished. In this manner, there is some assurance that at least with the newly used measurement site, there has been no aberration of the site due to electron bombardment by the electron microscope, and other forces. Alternatively, it may desirable to assess when the calibration standard 14 needs replacement, i.e. if the calibration standard 14 as measured by the electron microscope 12 returns a non-standard response. A new measurement site may be rotated in after a given number of calibration routines are performed. A mixture of previously measured sites and newly measured sites are used for each calibration procedure, in order to determine the information described above.

The actual width and other structural properties of each of the features on the calibration standard 14 have been traceably measured and are preferably already known within some statistical uncertainty. Thus, a comparison of the apparent width of a given measurement site with the actual known width of the measurement site provides a calibration factor that can be applied to measurements of the sample 16 to provide at least an intermediate measurement value that is compensated for the current conditions of the electron microscope 12. By using such differential data collected from several measurement sites on the calibration standard 14, the calibration factor can be even more precise.

Figure 2:
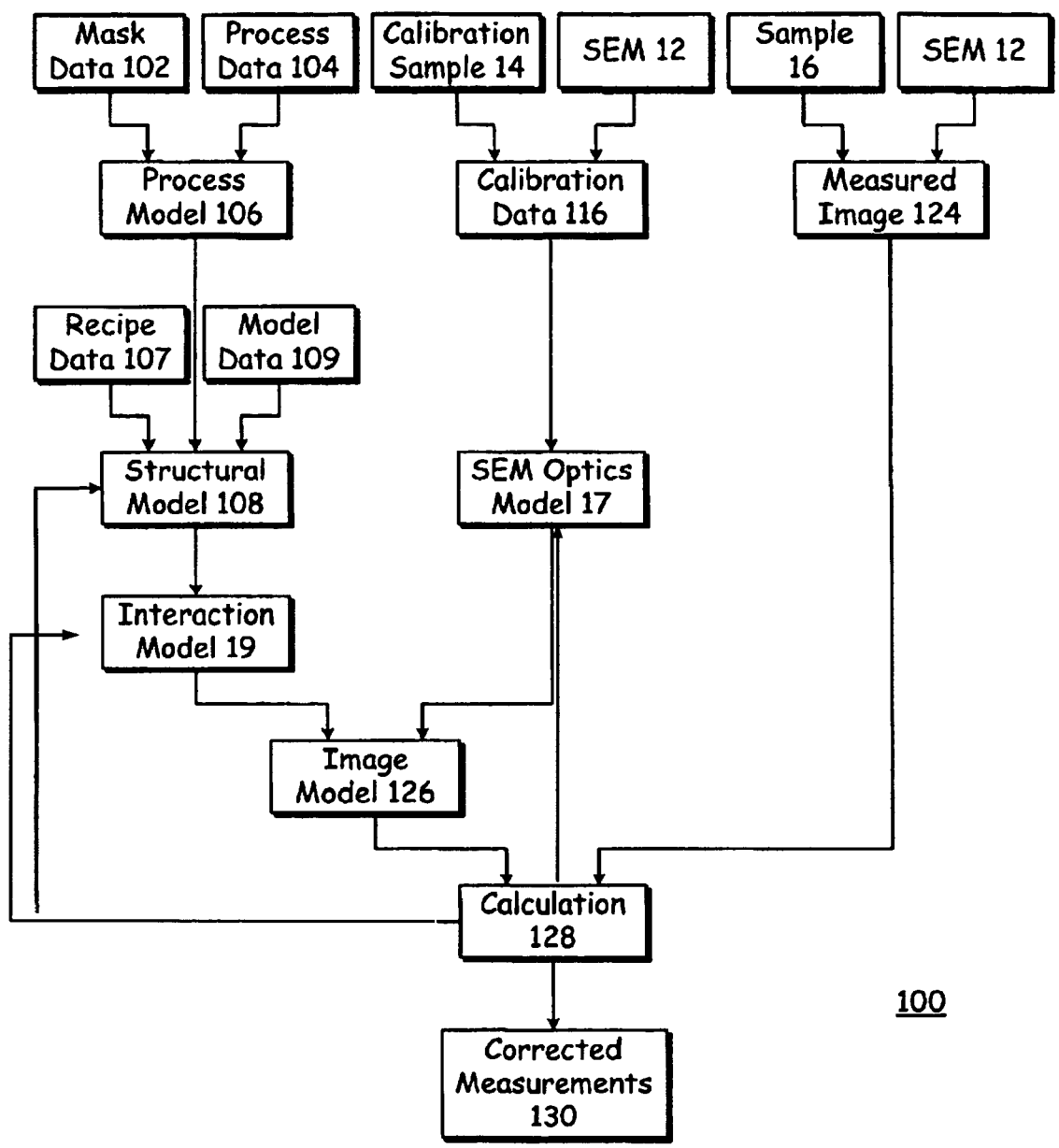
FIG. 2 is a flow chart showing a method for determining an actual measurement in critical dimension review according to a preferred embodiment of the invention.

With reference now to FIG. 2, there is depicted a flow chart illustrating an example of a method for correcting and converting an apparent width measurement into an actual width measurement, according to an embodiment of the present invention. It is appreciated that the invention makes use of models based on information such as that described herein, but is not limited to the exact models or information described in this example.

The method may use mask data 102 and process data 104 to construct a process model 106 as a part of the calibration. The mask data 102 represents information from a mask that is used to define the structure on the sample 16 that is to be measured. This information is beneficial because the actual width of the structure as defined on the mask is known with a high degree of precision and reliability. The process data 104 may include information in regard to the deposition and etch processes whereby the structure was created and formed, the material of which the structure is formed, the lithographic process by which the structure was formed, and so forth.

Using the process model 106, different mask data 102 is combined with different process data 104 in a database. A structural model 108 may then be created from the process model 106, recipe data 107, and model data 109. The recipe data 107 represents user-supplied information, such as is entered into a recipe by which the SEM 12 is controlled. The model data 109 may contain empirically determined data, such as sample material data from an x-ray microanalysis.

The structural model 108 contains specific information in regard to the sample that indicates the size and the shape that the structure should have, based on the material, mask, and processing that were used to construct the structure. An interaction model 19 is then constructed, based at least in part on the structural model 108. The interaction model 19 contains information in regard to how the scanning electron microscope 12, will interact with the structure on the sample 16, based on the information from the structural model 108, and is generally referred to as composition data, which includes composition or structural data. The interaction model may also include one or more parameters that depend on the electron microscope 12.

Looking now at calibration standard 14 of FIG. 2, the electron microscope 12 is used to measure the calibration standard 14, and produce calibration data 116, such as by using a method as described above. From the comparison of the actual widths of the measurement sites on the calibration sample 14 and the apparent widths of the measurement sites on the calibration standard 14 as sensed by the electron microscope 12, a SEM optics model 17 is developed, which contains information about how the electron microscope 12 is currently behaving with regard to critical dimension measurement of known samples, and is generally referred to as the calibration factor.

The SEM optics model 17 includes information about one or more result-effective parameters that characterize the electron optics of the electron microscope 12. These parameters may include, but are not limited to spot profile, tilt angle with respect to a measurement target, rotation angle with respect to a measurement target, resolution, charging, numerical aperture, atomic number, landing energy, aberration, energy spread, material electron yield, modulation transfer function (MTF), material electron yield, as well as spatial distortion, spatial variation, or time variation of such parameters. The SEM optics model 17 is used in conjunction with the interaction model 19 to produce a signal image model 126, which preferably is an image of the anticipated signal that the electron microscope 12 will produce when it is used to measure the sample 16, on which the structural model 108 is based. The sample 16 is measured using the SEM 12, and produces measured signal/image data 124, as depicted in FIG. 2.

Preferably, the measured signal image 124 that is produced from the actual measurement data is similar in data composition to the signal image model 126 that is produced from data that describes the sample 16 and the electron microscope 12. The measured signal image data 124 is compared to the signal/image model 126 in a calculation routine 128, from which the corrected measurements 130 are produced. The information in regard to the comparison of the image model 126 and the measured image 124 is fed back to the structural model 108, so as to further tune the calibration system. Through an iterative process, the parameters of the SEM optics model 17 and (in some cases) the interaction model 19 may be adjusted until the signal/image model 126 matches the measured signal/image 124. Once the model and measured signal/image match one or more parameters that characterize the beam optics of the electron microscope 12 are thus determined.

Although the preceding description concerns a system 10 that uses an electron microscope 12, those of skill in the art will recognize that embodiments of the present invention may be used with other metrology tools such as scatterometers, ellipsometers, reflectometers as well as probe-based tools such as a scanning tunneling microscope (STM) and atomic force microscope (AFM). For example, in the case of AFM or STM, tool parameters such as probe tip width or probe tip shape may be extracted by modeling the tip-sample interaction to produce a model-based image of a feature with a traceable dimension on the calibration sample. By iteratively adjusting the tool parameters until the measured image and model-based image match, the tool parameters (e.g., tip width) can be determined. Furthermore, microscope systems that use energetic beams other than electron beams e.g., ion beams, particle beams, photon beams etc., may be used instead of an electron microscope.

Embodiments of the present invention may also be used for tool matching. For example, the methods described above may be used to determine parameters that characterize a first metrology tool. Once a sufficient number of parameters have been determined for the first metrology tool, these parameter values may be used to calibrate a second metrology tool of the same make and model. Specifically, the first tool measures a known traceable dimension of a feature on a first calibration standard. Parameter values for the first tool are then determined as described above. The second tool measures a known traceable dimension of a feature on a second calibration standard. Parameters for the second tool may be determined as described above. If the traceable dimensions on the two standards have the same value, the second tool may be adjusted until the parameter values of the two tools are the same. Again, it is not necessary for the two tools to measure the same standard. Even if the standards in the two or more tools do not have the same exact dimension, by calibrating both the tools with respect to the two traceable standards will automatically guarantee the matching of the two tools. In fact, two tools that are capable to measure accurately are by definition matched.

A number of different types of calibration standards may be used in conjunction with embodiments of the present invention. The following are but a few examples of many possible types of standards.

Figure 3A:
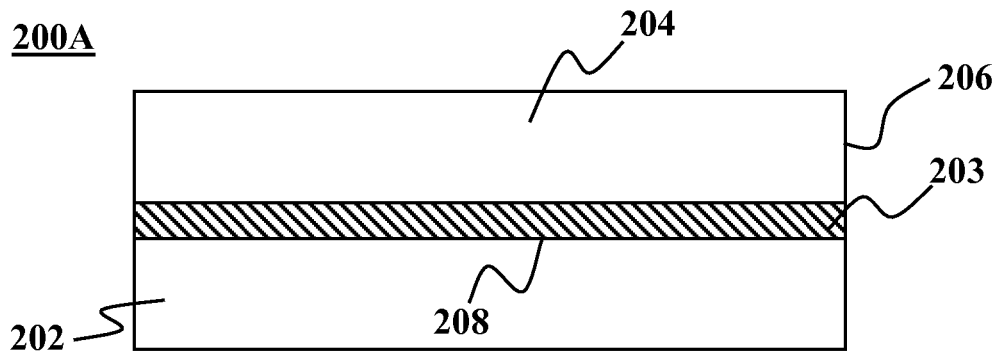
FIGS. 3A-3D are cross-sectional views a feature that may be used on calibration standards in conjunction with embodiments of the present invention.
Figures 3B, 3C:
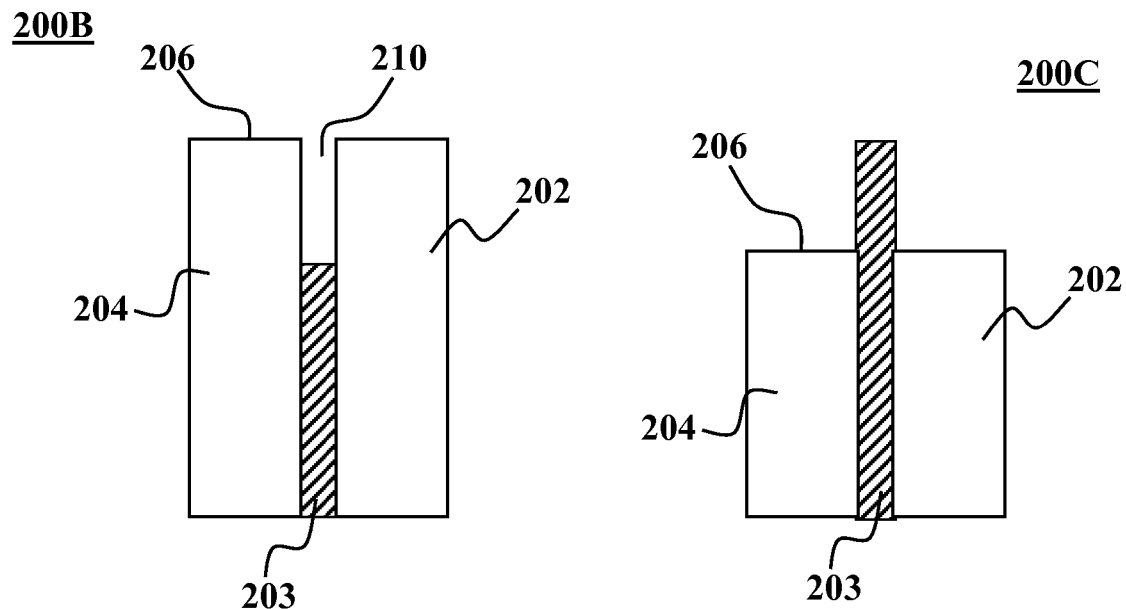

According to an embodiment of the present invention, the feature on the calibration standard 14 may be of the types depicted in FIGS. 3A-3C. As shown in FIG. 3A, a standard 200A may generally include a first substrate 202 spaced from a second substrate 204. At least one layer 203 is disposed between the first and second substrates. The layer 203 comprises a traceably measured thickness. The first and second substrates may be made of semiconductor materials such as silicon. Alternatively, the substrates 202, 204 may also include silicon germanium, gallium arsenide, glass, and quartz. The layer 203 may be made of any suitable material, e.g., polysilicon, metals, dielectrics, and any combination thereof. For example, the layer 203 may include a dielectric layer such as a thermally grown silicon dioxide. A thermally grown silicon dioxide may be formed using any method known in the art, e.g., a thermal oxidation furnace. A viewing surface of the calibration standard comprises a cross-sectional surface 206 of the calibration standard 200. The cross-sectional surface is substantially perpendicular to an upper surface 208 of at least the first substrate 202 such that a lateral dimensional artifact of the calibration standard comprises the traceably measured thickness of the layer 203. The traceably measured thickness of the layer 203 may be between about 10 nm and about 500 nm.

FIG. 3B depicts a standard 200B that is a variation on the standard 200A of FIG. 3A. A portion of the layer 203 extending from the cross-sectional surface 206 has been removed (e.g., by etching) to form a trench. Alternatively, FIG. 3C depicts a standard 200C in which portions of the first and second substrates extending from the cross-sectional surface 206 have been removed (e.g., by selective etching) leaving a portion of the layer 203 extending above the cross-sectional surface 206. Fabrication of such structures is described in more detail in U.S. Pat. No. 6,646,737, which is incorporated herein by reference.

Figure 3D:
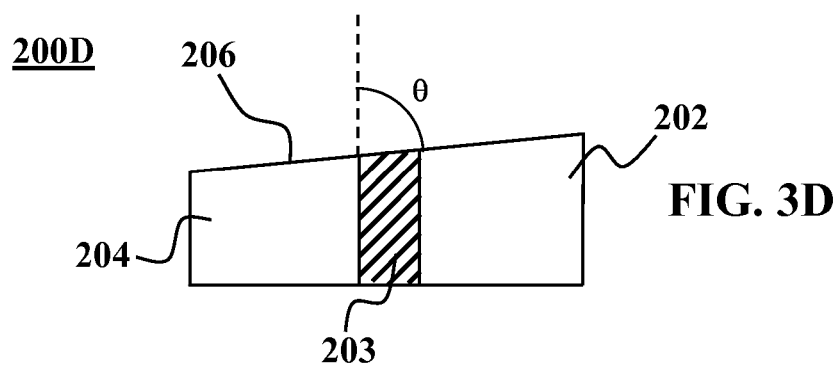

In another variation, FIG. 3D depicts a standard 200D having a non-vertical sidewall angle. Starting with a structure of the type depicted in FIG. 3A, the cross-sectional surface 206 may be polished at a non-perpendicular angle θ and then mounted such that the layer 203 and adjoining surfaces of the substrates 202, 204 are at traceable non-perpendicular angles with respect to the cross-sectional surface 206. A portion of the layer 203 may be removed, e.g., by a suitable etching technique, so that an edge of the layer 203 lies below the level of the cross-sectional surface 206 to create an angled trench as shown in FIG. 3D. Alternatively, portions of the first and second substrates 202, 204 may be removed so that a portion of the layer 203 projects beyond the level of the viewing surface 206 to create an angled protrusion as opposed to an angled trench. In the case of a trench or projection, the angle θ may be measured and certified by looking along the layer 203 from the side with a low magnification optical microscope. Fabrication of such angled features is described in more detail in commonly-assigned U.S. patent application Ser. No. 10/770,151 to Marco Tortonese et al., entitled "DIMENSIONAL CALIBRATION STANDARDS", which was filed on Jan. 31, 2004, the disclosures of which are incorporated herein by reference.

Figure 4:
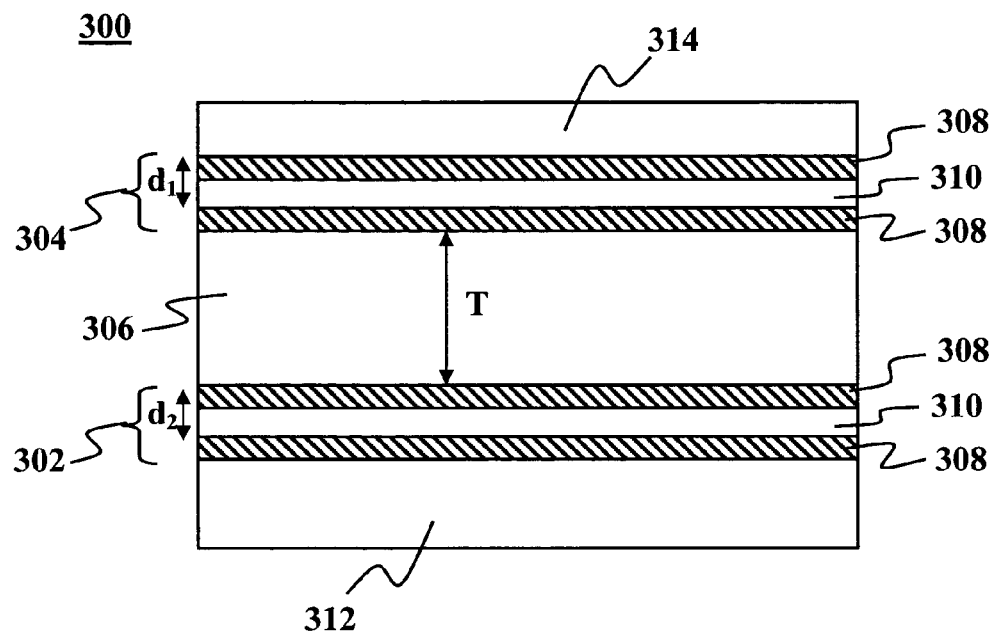
FIG. 4 is a cross-sectional view of an overlay calibration standard in accordance with embodiments of the present invention.

According to another embodiment of the present invention, the calibration standard 14 may include an overlay structure. An overlay standard can be used to verify the symmetry of pairs of parallel lines or similar features. FIG. 4 depicts an example of such an overlay standard 300 that generally includes first and second line structures 302, 304 separated by a spacer layer 306 located between them. The first and second line structures 302, 304 are respectively characterized by line spacings $d_1$, $d_2$. A variation between the first line spacing $d_1$ and the second line spacing $d_2$ is traceably measured. The second line structure 304 is symmetrical with respect to the first line structure 302. Preferably, first and second line spacings $d_1$, $d_2$ are equal. A viewing surface of the overlay standard 300 comprises a cross-sectional surface that intersects the layers comprising the line structures 302, 304 and spacer layer 306. In the example depicted in FIG. 4, the viewing surface is in the plane of the drawing. The first and second line structures 302, 304 each include a thick layer 310 between first and second thin layers 308. The line structures 302, 304 may include additional lines provided the two line structures 302, 304 are symmetric with respect to an axis located midway between them. The layers forming the line structures and spacer layer may be deposited in a sequence on a substrate 312 and covered with an overlayer 314.

To provide for a traceable variation in the line spacings $d_1$, $d_2$, for example, a thickness of the thin layers 308 and a thickness of the spacer layer 310 may be traceable. Furthermore, the spacer layer 306 may have a traceable thickness T. Preferably, the thickness of the thick layers 310 is traceable. By way of example, the thin layers 308 may each be about 1 micron thick and the thick layers 310 may be greater than about 1 micron thick. The spacer layer 306 may be about 70 microns thick. To provide contrast, each thick layer 310 may be made of a different material than the corresponding first and second thin layers 308 and the spacer layer 306. By way of example, the thin layers 308 of each line structure may be made of made of polysilicon and the thick layer 310 of each line structure and spacer layer 306 may be made of silicon dioxide. The overlay standard 300 may be fabricated out of two "by cleaving a double layer wafer into two sections, gluing the two sections together back to back and polishing the viewing surface. Such a technique allows the standard 300 to be built out of two "identical" (or nearly identical) parts such that the thickness of the glue is not a factor.

Figure 5:
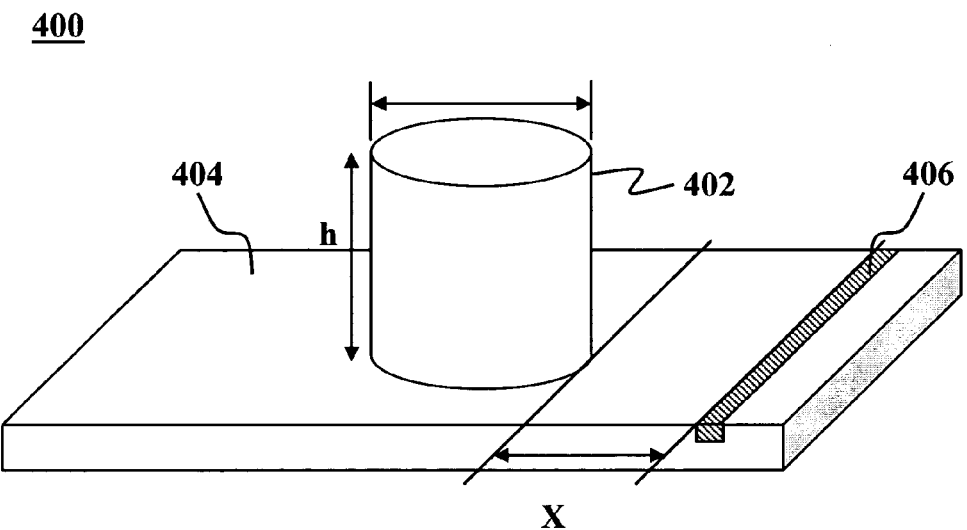
FIG. 5 is a cross-sectional view of a calibration standard for reproducing the features of an optical proximity correction (OPC) pattern in accordance with embodiments of the present invention.

In another alternative embodiment, the calibration standard 14 may be a three-dimensional standard that reproduces the features of an optical proximity correction (OPC) pattern. In such a case, the method depicted in the flow chart of FIG. 2 may be modified by adding the step of calibrating out electron proximity effects that affect measurements of OPC features from a measurement made with the SEM 12 or other metrology tool. As shown in FIG. 5, a calibration standard 400 that reproduces the features of an optical proximity correction (OPC) pattern may be in the form of a circular post 402 formed, e.g., on a substrate 404. The post 402 has a traceably measured height h and diameter D. Such a feature may be fabricated through a suitable sequence of deposition, masking and etching steps.

Such a feature could be used, e.g., for reticle metrology. OPC features typically appear on a reticle). The post 402 could be located in close proximity to another feature, such as a line 406, or other feature. In the case of a line, then the calibrated distance would be the distance X between the post 402 and the line 406. Such distance may be an important parameter to know in order to correctly assess the effectiveness of reticle OPC features. In order to manufacture such a standard, one could build a reticle using conventional technology, then measure the distance between the post and the line with, for example, a calibrated AFM.

Figure 6:
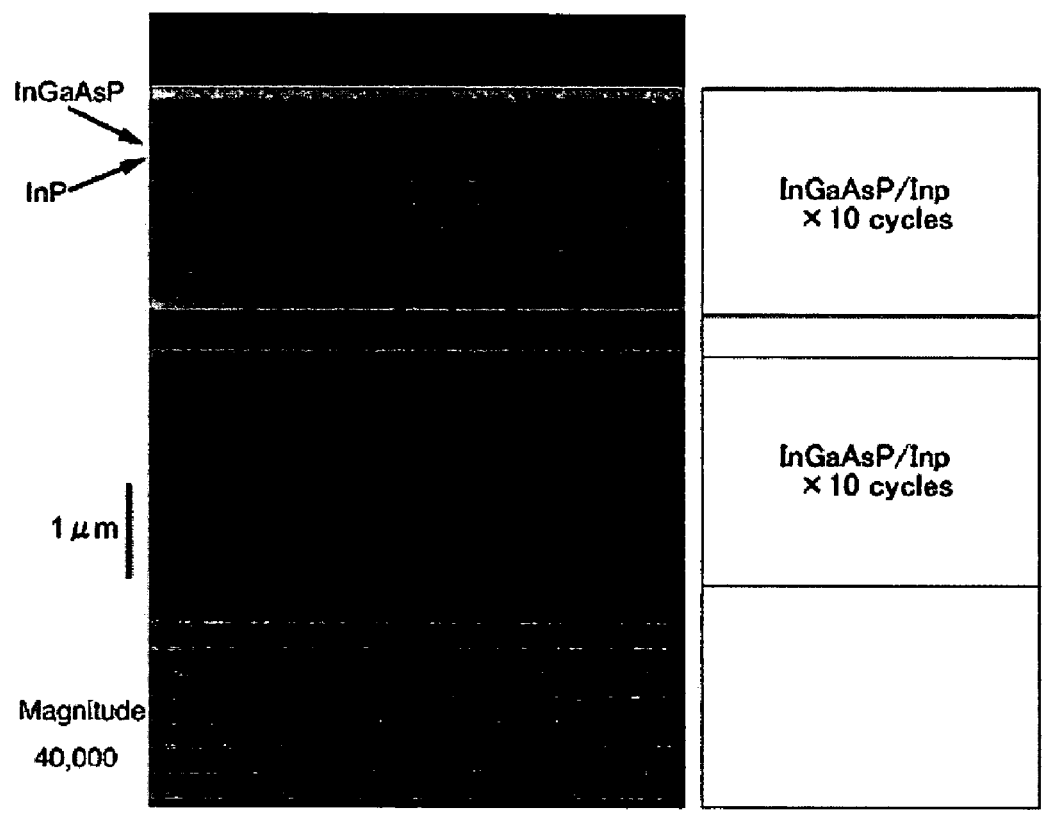
FIG. 6 is an electron micrograph of a superlattice that may be used as a calibration standard according to an embodiment of the present invention.

In another alternative embodiment, the feature on the calibration standard 14 may include a line or trench that is smaller than a spot size of an electron beam generated by the SEM 12. A similar standard could be use to extract information on the beam profile. For example, a 1.5-nm wide line or trench is sufficiently narrow compared to the spot size generated by most electron beam tools. Features of this kind can be manufactured by using Molecular Beam Epitaxy (MBE). This process can guarantee atomic accuracy in layer deposition, and it is currently used to create quantum superlattices (SL) and arrays of quantum dots. An example of an SEM of a quantum SL is shown in FIG. 6.

Figure 7:
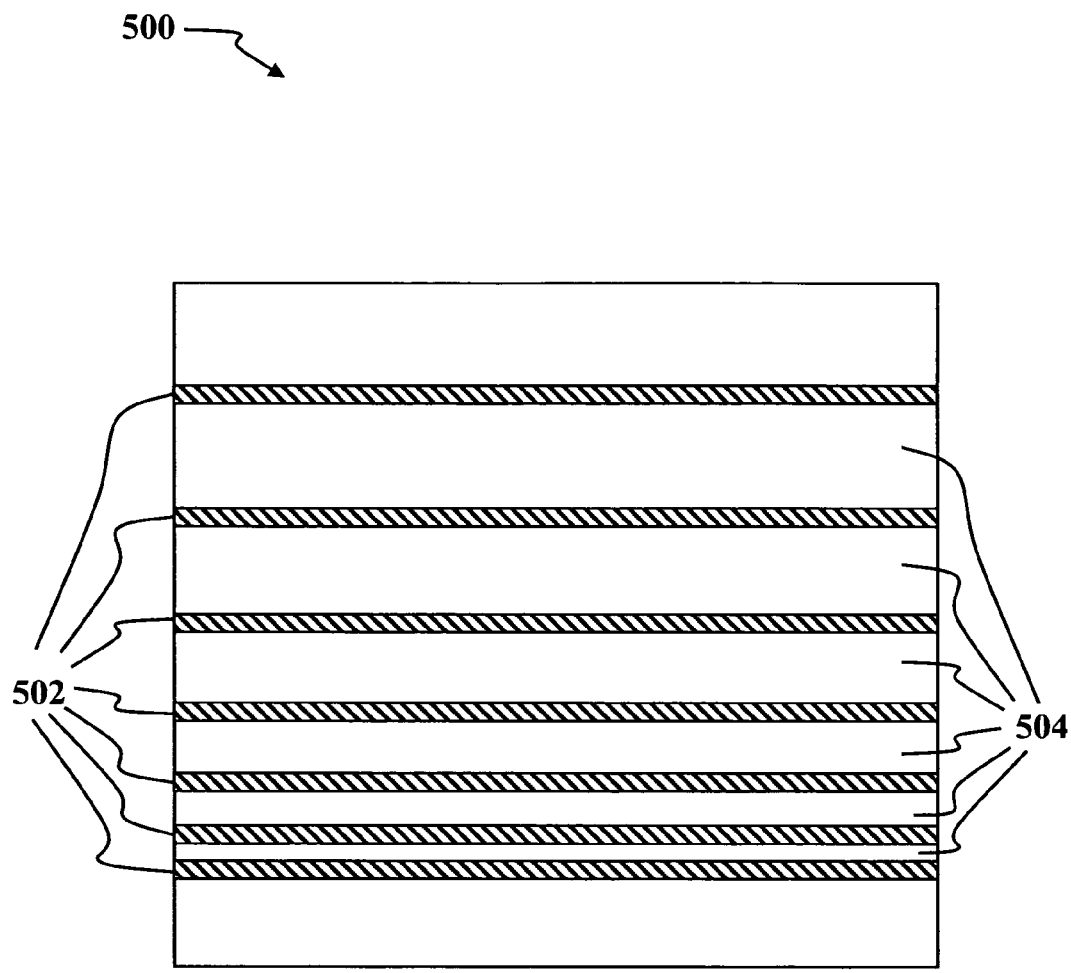
FIG. 7 is a cross-sectional view of a calibration configured for proximity effect calibration according to an embodiment of the present invention.

In another embodiment of the invention the calibration standard 14 may be configured for proximity effect calibration. In such a case, the feature on the calibration standard may include a plurality of lines, wherein the spacing between adjacent lines varies. FIG. 7 depicts an example of such a calibration standard 500. The standard includes a sequence of alternating layers of different materials. A viewing surface of the overlay standard 500 comprises a cross-sectional surface that intersects the layers in such a way as to reveal a set of lines 502 separated by spaces 504. The spacing between pairs of adjacent lines is traceably measured. In the example depicted in FIG. 7, the widths of the spaces 504 steadily increase from the bottom of the drawing towards the top. A structure such as that depicted in FIG. 7 may be fabricated by depositing layers of steadily increasing (or decreasing) thickness on a substrate and then cutting a cross-section through the layers.

In another alternative embodiment, the feature on the calibration standard 14 has a variable material composition. For example, different portions of the feature may have different material compositions. The material composition of each portion is preferably measured in a traceable manner, e.g., with SIMS, Auger electron spectroscopy, or other traceable techniques that are sensitive to chemical composition. Using a measured signal from the calibration standard, information about the effect of material composition on the parameters of the SEM system 12 may be determined.

In embodiments of the present invention where the metrology tool includes an electron beam system an important parameter is the modulation transfer function (MTF) of the electron beam system. The MTF relates a modulation of a stimulus applied to the electron beam system to a modulation of a signal or image produced by the electron beam system. There are several different calibration standards that may be used to determine MTF in conjunction with embodiments of the method of the present invention.

For example the calibration standard 14 may include a feature in the form of two or more different pitch structures. Each pitch structure has a plurality of parallel lines or trenches with a traceably measured pitch (distance between adjacent lines). A calibration standard for pitch structures may include a series of closely spaced lines with a space between each pair of adjacent lines. Each line and space has a specific width. Such a structure may be fabricated by depositing onto a substrate a regular sequence of layers of alternating materials and taking a cross-section of the resulting structure. A fast Fourier transform (FFT algorithm) may be used to determine the MTF from the signal and the known pitch structure of the calibration standard.

Alternatively, the feature on the calibration standard 14 includes one or more knife-edges, e.g., a single knife-edge or two orthogonal knife-edges. Furthermore, the feature on the calibration standard may include a delta function. Such a feature may include quantum wire structures that define a very narrow line. In this case the thickness of the quantum wire structure is the traceable dimension. An electronic image of the quantum wire structure is essentially a line spread function that contains information on the MTF of the optical system.

In another embodiment of the invention, the calibration standard 14 may include an electrically active feature that may be charged to a desired voltage. The electrically active feature preferably has a traceably measured dimension. For example, in a line structure of any of the types described above, one or more lines may be electrically charged, e.g., through an external wire connected to a source of voltage or by an impinging electron beam. By way of example, the voltage to which the line is charged may be the traceably measured dimension.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for determining a parameter of a semiconductor wafer and/or reticle metrology tool, comprising the steps of:
    measuring a dimension of a feature on a calibration standard with the metrology tool, wherein the dimension has a known value and wherein the known value is traceable; and using the measured dimension and the known value to obtain a determined value of the parameter of the metrology tool.

2. The method of claim 1 wherein the metrology tool is a scatterometer, ellipsometer, reflectometer, as probe-based tool, scanning tunneling microscope (STM), atomic force microscope (AFM), ion beam, particle beam, photon or other energetic beam microscope system, scanning electron microscope or critical dimension scanning electron microscope (CD-SEM).

3. The method of claim 2 wherein the parameter is spot profile, tilt angle with respect to a measurement target, rotation angle with respect to a measurement target, resolution, charging, numerical aperture, atomic number, landing energy, aberration, energy spread, material electron yield, spatial distortion of parameters to be determined, spatial variation of parameters to be determined, or time variation of a parameter.

4. The method of claim 1 further comprising entering the value of the parameter into a model-based metrology library.

5. The method of claim 4 further comprising generating a calibration curve from the model-based metrology library.

6. The method of claim 1 further comprising using the parameter in a measurement model that takes the parameter into account when generating results of measurements made with the metrology tool.

7. The method of claim 1 wherein the calibration standard includes:
- a first substrate spaced from a second substrate; and
- at least one layer disposed between the first and second substrates, wherein the at least one layer comprises a traceably measured thickness, wherein a viewing surface of the calibration standard comprises a cross-sectional surface of the calibration standard,
- wherein the cross-sectional surface is substantially perpendicular to an upper surface of at least the first substrate such that a lateral dimensional artifact of the calibration standard comprises the traceably measured thickness of the at least one layer.

8. The method of claim 7 wherein the traceably measured thickness is between about 10 nm and about 500 nm.

9. The method of claim 7 wherein a portion of the at least one layer or the substrates extending from the cross-sectional surface is removed to form a trench or line in the calibration standard.

10. The method of claim 8, wherein the trench has a non-vertical sidewall angle.

11. The method of claim 1 wherein the metrology tool is probe-based tool having a probe and the parameter is a parameter of the probe.

12. The method of claim 11 wherein the parameter of the probe is a probe tip width, a probe tip shape, tilt angle with respect to a measurement target, rotation angle with respect to a measurement target, spatial distortion, spatial variation, or time variation of a parameter.

13. The method of claim 1 wherein the dimension is an atomic number of an elemental material in the feature.

14. The method of claim 1 wherein the feature on the calibration standard is an electrically active feature, the method further comprising charging the electrically active feature to a desired voltage.

15. The method of claim 1 wherein the calibration standard is a three-dimensional standard that reproduces the features of an optical proximity correction (OPC) pattern.

16. The method of claim 15 further comprising calibrating out electron proximity effects that affect measurements of OPC features from a measurement made with the metrology tool.

17. The method of claim 15 wherein the feature on the calibration standard is in the shape of a circular post.

18. The method of claim 1 wherein the feature on the calibration standard includes a line or trench that is smaller than a spot size of an electron beam generated by the metrology tool.

19. The method of claim 1 wherein the calibration standard is configured for proximity effect calibration.

20. The method of claim 19 wherein the feature on the calibration standard includes a plurality of lines, wherein a spacing between adjacent lines varies.

21. The method of claim 1 wherein the feature on the calibration standard has a variable material composition.

22. The method of claim 1 wherein the metrology tool includes an electron beam system and the parameter is a modulation transfer function (MTF) of the electron beam system.

23. The method of claim 22 wherein the feature of the standard includes two or more different pitch structures.

24. The method of claim 22 wherein the feature on the calibration standard includes a series of closely spaced lines with a space between each pair of adjacent lines, wherein each line and space has a specific width in conjunction with a fast Fourier transform (FFT algorithm).

25. The method of claim 22 wherein the feature on the calibration standard includes one or more knife-edges.

26. The method of claim 25 wherein the one or more knife-edges include a single knife-edge.

27. The method of claim 25 wherein the one or more knife-edges include two orthogonal knife-edges.

28. The method of claim 22 wherein the feature on the calibration standard includes a delta function.

29. The method of claim 1 further comprising, measuring a dimension of a feature on a second calibration standard with a second metrology tool to obtain a second measured dimension, wherein the dimension of the feature on the second calibration standard has a traceable value, wherein the semiconductor wafer and/or reticle metrology tool (first metrology tool) and the second metrology tool are of the same make and model;
- using the second measured dimension and the traceable value of the dimension of the feature on the second calibration standard to obtain a determined value of a parameter of the second metrology tool, wherein the parameter of the second metrology tool is the same parameter as the parameter of the first metrology tool; and
- adjusting the parameter of the second metrology tool so that it has the same value as the determined value of the parameter of the first metrology tool.

* * * * *